(12) United States Patent
Ceylan et al.

(10) Patent No.: US 7,830,220 B2
(45) Date of Patent: Nov. 9, 2010

(54) MODULATOR ARRANGEMENT AND METHOD FOR SIGNAL MODULATION

(75) Inventors: Nazim Ceylan, München (DE); Jan-Erik Müller, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 1077 days.

(21) Appl. No.: 11/527,949

(22) Filed: Sep. 26, 2006

(65) Prior Publication Data

US 2008/0074209 A1  Mar. 27, 2008

(51) Int. Cl.
*H03K 7/10* (2006.01)
*H04L 25/49* (2006.01)

(52) U.S. Cl. .................. 332/145; 332/151; 330/127; 375/297; 455/102; 455/114.3; 455/126; 455/127.2

(58) Field of Classification Search ............... 332/108, 332/151, 144, 145; 330/127, 129, 147, 289–291; 375/269, 297; 455/114.3, 127.1, 127.2, 127.5, 455/126, 102, 108

See application file for complete search history.

(56) References Cited

U.S. PATENT DOCUMENTS

| | | | | |
|---|---|---|---|---|
| 6,101,224 A * | 8/2000 | Lindoff et al. | ............... | 375/300 |
| 6,868,279 B2 * | 3/2005 | Sahlman et al. | ............. | 455/522 |
| 7,271,662 B2 * | 9/2007 | Akamine et al. | ............ | 330/310 |
| 7,366,482 B2 * | 4/2008 | Hara et al. | ............... | 455/127.1 |
| 7,555,057 B2 * | 6/2009 | Staszewski et al. | ......... | 375/296 |
| 2005/0105642 A1 * | 5/2005 | Muller et al. | ............... | 375/296 |
| 2005/0111574 A1 * | 5/2005 | Muller et al. | ............... | 375/296 |

FOREIGN PATENT DOCUMENTS

| | | |
|---|---|---|
| DE | 102004047724 A1 | 5/2005 |
| DE | 102004047684 A1 | 6/2005 |
| DE | 102004019984 A1 | 11/2005 |
| DE | 102005013880 B3 | 4/2006 |
| DE | 102005013881 A1 | 9/2006 |
| WO | WO 01/24356 A1 | 4/2001 |

OTHER PUBLICATIONS

"Amplifier Linearization Using a Digital Predistorter with Fast Adaptation and Low Memory Requirements", James K. Cavers, IEEE Transactions on Vehicular Technology, vol. 39, No. 4, Nov. 1990, pp. 374-382.

"Lookup Table Address Scaling in a Digital Predistorter for a Power Control of a Transmitter Path in Mobile Communication Devices", Dr. Jan-Erik Müller and Nazim Ceylan, Siemens AG 2005, file: 2005J52258.doc, 10 pgs.

* cited by examiner

*Primary Examiner*—Robert Pascal
*Assistant Examiner*—Levi Gannon
(74) *Attorney, Agent, or Firm*—Eschweiler & Associates, LLC (57) ABSTRACT

A modulator arrangement includes a power amplifier which receives a carrier signal and has a current control input and a voltage supply input. The modulator arrangement further includes a supply voltage modulator having an output coupled to the voltage supply input and an input coupled to the data input and a bias current modulator with an output coupled to the current control input and an input coupled to the data input. A control unit is provided which has a power control output coupled to the supply voltage modulator and to the bias current modulator to control the supply voltage modulator and the bias current modulator depending on a power control signal.

20 Claims, 10 Drawing Sheets

MODULATOR ARRANGEMENT AND METHOD FOR SIGNAL MODULATION

FIELD OF THE INVENTION

The invention relates to a modulator arrangement and to a method for signal modulation.

BACKGROUND OF THE INVENTION

The requirements for the signal quality of modulators, for example in transmitting devices, become more stringent as the need for high data rates and increasing mobility grows. The modern mobile radio standards such as universal mobile telecommunications system (UMTS), wideband code division multiple access (WCDMA), global system for mobile communication (GSM), enhanced data rates for GSM evolution (EDGE), Bluetooth medium data rate or Wireless local area network (WLAN) according to 802.11a/b/g require special modulation types for data transmission, which modulate, for example, both the phase and the amplitude of a carrier signal at the same time.

Simultaneous amplitude and phase modulation make it possible to achieve higher data transmission rates and thus better bandwidth efficiency. The mobile radio standards mentioned above envisage, for example, the use of quadrature phase shift keying (QPSK), eight phase shift keying (8-PSK) or quadrature amplitude modulation (QAM) as modulation types for the data transmission.

Depending on the selected application for the individual mobile radio standards, these high-quality modulation types are used not only for data transmission from a base station to a mobile communication appliance but also from the mobile communication appliance to the base station.

The modulation types which are used for modern mobile radio standards are particularly sensitive to possible distortion which is produced by various components in a transmission path. Distortion such as this in the transmission path leads to changes in the phase and amplitude of a carrier signal. This results in data errors in the transmitted signal.

In order to suppress the distortion, it can be desirable to provide components in the modulator arrangement which have a highly linear transmission characteristic. In this case, the expression, 'linearity of transmission characteristic', means a transmission response of an element within the modulator arrangement which essentially produces an output signal that is proportional to the respective input signal. Accordingly, circuits whose transmission responses show non-linear behavior produce an output signal which is not proportional to the respective input signal. Such a non-linearity can lead to data errors within the transmitted signal.

Elements having a non-linear transmission characteristic can, for example, be amplifiers provided in the transmission path. By way of example, in the case of power amplifiers, a high degree of linearity in the output signal is achieved by operating the power amplifiers considerably below their maximum achievable output power level. This is referred to as operation in a linear area of the characteristic.

However, operation of a power amplifier in this way can lead to a high quiescent current being drawn, thus increasing the overall power consumption. Particularly in the case of mobile communication appliances, an operating time is reduced by a greater current, which is governed by the capacity of rechargeable batteries used in the mobile communication appliance.

Modern mobile communication appliances usually attempt to reach a compromise between the current that is drawn and the linearity of the individual active switching elements in a transmission path. This can be achieved by suitable circuitry. By way of example, it is possible to reduce the current that is drawn by choice of suitable biasing, the adjustment of the operating points, and by a suitable load impedance of the output of the components having a non-linear characteristic.

In order to further improve a transmission response of the overall transmission path and in order to reduce possible data errors, it is normal in modern transmitting devices to additionally predistort the input signal.

In the example of predistortion, an improvement in the signal quality is achieved by supplying a distorted signal to the amplifier or to the component with the non-linear characteristic, respectively. The distortion is in this example chosen such that the distortion caused by the transmission response is accurately compensated for. It is then once again possible to tap off a signal which is approximately proportional to the input signal at the output of the amplifier or of the component with a non-linear characteristic.

The use of a predistortion, however, causes a higher power consumption in a modulator arrangement or transmitting device. It therefore can be desirable to find a tradeoff between a power efficient operating range of amplifiers and a use of predistortion in the modulator arrangement.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

In one embodiment of the invention, a modulator arrangement comprises a data input to receive amplitude data and a control input to receive power data. A power amplifier is provided to perform an amplitude modulation of a carrier signal either as a function of a modulated supply voltage corresponding to the amplitude data or as a function of a modulated bias current control signal corresponding to the amplitude data depending on a power control signal. A control unit is provided to derive the power control signal from the power data.

Accordingly, an amplitude modulation of a carrier signal is performed either as a function of a modulated supply voltage corresponding to the amplitude data or as a function of a modulated bias current corresponding to the amplitude data depending on the power control signal.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

The invention is explained in detail below using exemplary embodiments with reference to the drawing, in which.

DETAILED DESCRIPTION OF THE INVENTION

In the following description further aspects and embodiments of the present invention are summarized. In addition, reference is made to the accompanying drawings, which form a part hereof, and in which is shown by way of illustration, in which the invention may be practiced. The embodiments of the drawings present a summary in order to provide a better understanding of one or more aspects of the present invention. This summary is not an extensive overview of the invention and neither intended to limit the features or key-elements of the invention to a specific embodiment. Rather, the different elements, aspects and features disclosed in the embodiments can be combined in different ways by a person skilled in the art to achieve one or more advantages of the present invention. It is to be understood that other embodiments may be utilized and structural or logical changes may be made without departing from the scope of the present invention. The elements of the drawing are not necessarily to scale relative to each other. Like reference numerals designate corresponding similar parts.

Figure 1:
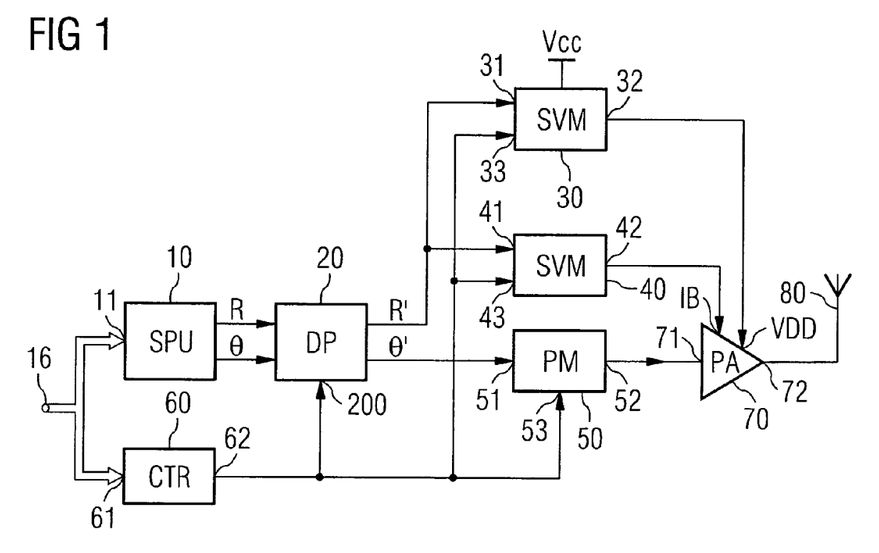
FIG. 1 is a block diagram of a first exemplary embodiment of a modulator arrangement according to the invention.

FIG. 1 shows an exemplary embodiment of a modulator arrangement comprising a signal processing unit (SPU) 10 and a predistorter device (DP) 20 which is coupled to the output of the signal processing unit 10 to receive an amplitude component R and a phase component θ. The modulator arrangement further comprises a supply voltage modulator (SVM) 30, a bias current modulator 40, and a phase modulator (PM) 50. The supply voltage modulator 30 and the bias current modulator (BCM) 40 comprise signal inputs 31, 41 coupled to the predistorter device 20 to receive a predistorted amplitude component R'. The phase modulator 50 comprises a signal input 51 to receive a predistorted phase component θ' from the predistorter device.

Furthermore, a power amplifier (PA) 70 is provided which comprises a signal input 71 coupled to a signal output 52 of the phase modulator 50, a current control input IB coupled to an output 42 of the bias current modulator 40, and a supply voltage input VDD coupled to an output 32 of the supply voltage modulator 30. A signal output 72 of the power amplifier 70 is coupled to an antenna device 80.

The arrangement further comprises a control unit (CTR) 60 having an input 61 coupled to an input 16 and a connector 11 of the signal processing unit 10. The control unit 60 further comprises a control output 62 which is coupled to a control input 200 of the predistorter device 20, to a control input 33 of the supply voltage modulator 30, to a control input 43 of the bias current modulator 40, and to a control input 53 of the phase modulator 50. In an alternative embodiment the control unit 60 can be comprised by the signal processing unit 10.

The input 16 comprises a data input configured to receive input data which are to be modulated in the modulator arrangement and a control input to receive power data corresponding, for example, to a desired output power of the power amplifier 70. Also other information can be received from input 16. In other words, input 16 forms a data bus which comprises transmitter related data and control information. The connector 11 of the signal processing unit 10 is coupled to the data input 16 to receive the input data and derive the amplitude component R and the phase component θ from the input data which can comprise a filtering of the input data, for example. Also the power data can be provided to the signal processing unit 10 for deriving the signal components R, θ. The amplitude component R and the phase component θ can be provided as digital components.

The control unit 60 receives the power control data at its input 61. The power control data can be received directly from the input 16 or from the signal processing unit 10. A power control signal is derived from the power control data and provided to the supply voltage modulator 30, the bias current modulator 40, and the phase modulator 50 to control their respective functions. Furthermore, a predistortion control signal is derived from the power control data and provided to the predistorter device 20 to activate or deactivate a predistortion of the amplitude component R and the phase component θ.

The phase modulator 50 generates a phase modulated carrier signal as a function of the phase information provided by the phase component θ'. The phase modulator 50 can comprise a sigma-delta modulator to generate the carrier signal, for example. An amplitude of the carrier signal can be determined depending on the power control signal which, for example, comprises an output gain factor. The output gain factor or the amplitude of the carrier signal, respectively, are usually held constant for at least several periods or bursts of the carrier signal. In other words, usually no amplitude modulation is performed by controlling the phase modulator 50 with the power control signal.

The supply voltage modulator 30 can vary an output voltage at its output 32 as a function of the amplitude component provided at the signal input 31. The power amplifier 70 amplifies the carrier signal depending on the modulated supply voltage which results in an amplitude modulation of the carrier signal.

Accordingly, the bias current modulator 40 can vary an output current at its output 42 as a function of the amplitude component R' at its input 41. In other words, the bias current modulator 40 provides a modulated bias current depending on the amplitude component R'. Again, the power amplifier 70 amplifies the carrier signal, wherein the amplification is a function of the modulated bias current.

In an alternative embodiment the bias current modulator 40 can vary a bias current control signal which can comprise an output voltage at its output 42 as a function of the amplitude component R' at its input 41, such that the variation results in a bias current modulation at the output 72 of the power amplifier 70.

The control unit 60 controls the supply voltage modulator 30 and the bias current modulator 40 such that either a supply voltage modulation is performed, wherein the bias current modulator 40 provides a constant bias current and thus performs no bias current modulation, or a bias current modulation is performed, wherein a constant supply voltage is provided by the supply voltage modulator 30. This is controlled by the power control signal. In each case, the modulator arrangement corresponds to a polar modulator, which performs a polar modulation of the input data provided at the input 16.

For example, the control unit 60 derives the power control signal from the power control data in such a way that a supply voltage modulation is performed for power control data corresponding to a high output power of the power amplifier 70 and a bias current modulation is performed for power control data corresponding to a low output power.

Figure 12A:
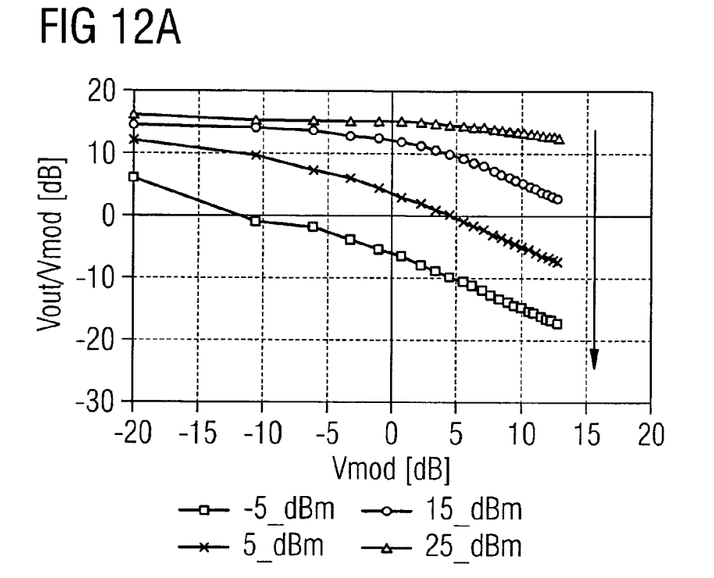
FIGS. 12A and 12B are exemplary diagrams of a transmission characteristic using a supply voltage modulation.
Figure 12B:
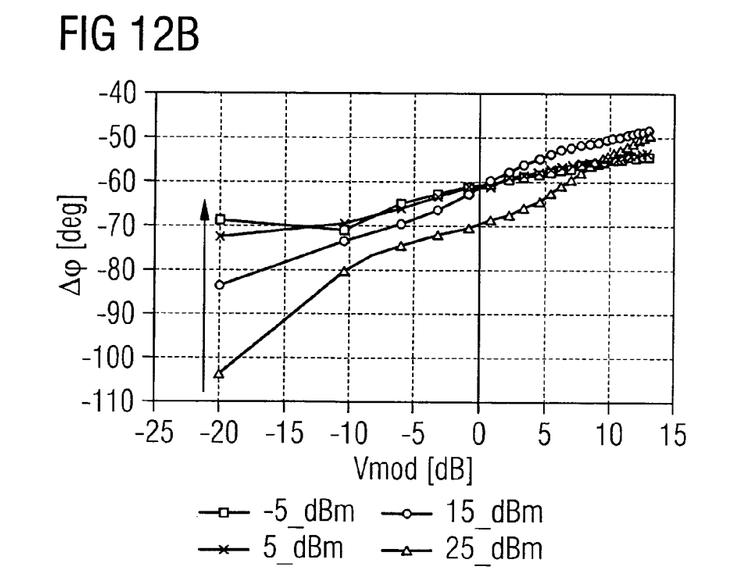

FIGS. 12A and 12B show an exemplary diagram of an amplitude and a phase response of a power amplifier 70, wherein an amplitude modulation is performed using supply voltage modulation. FIG. 12A shows an amplitude response of the power amplifier by a relation of an output signal Vout to the modulated supply voltage Vmod as a function of the modulated supply voltage Vmod. The four graphs shown, denoted by a square symbol, a cross symbol, a circle symbol, and a triangle symbol, correspond to different input powers of respective carrier signals. The arrows in each of the diagrams denote a decreasing input power to the power amplifier.

Accordingly, in FIG. 12B a phase response of the power amplifier is shown by a phase shift $\Delta\phi$ as a function of the modulated supply voltage Vmod.

It can be seen from the diagrams that, when using supply voltage modulation, distortions are generated mainly for lower output powers, resulting in a non constant voltage gain. For higher output powers, the gain variation is low, which results in a low distortion. Depending on a mobile communication standard in which the modulation is used, it can be possible to deactivate a predistortion of the modulation data.

Figure 13A:
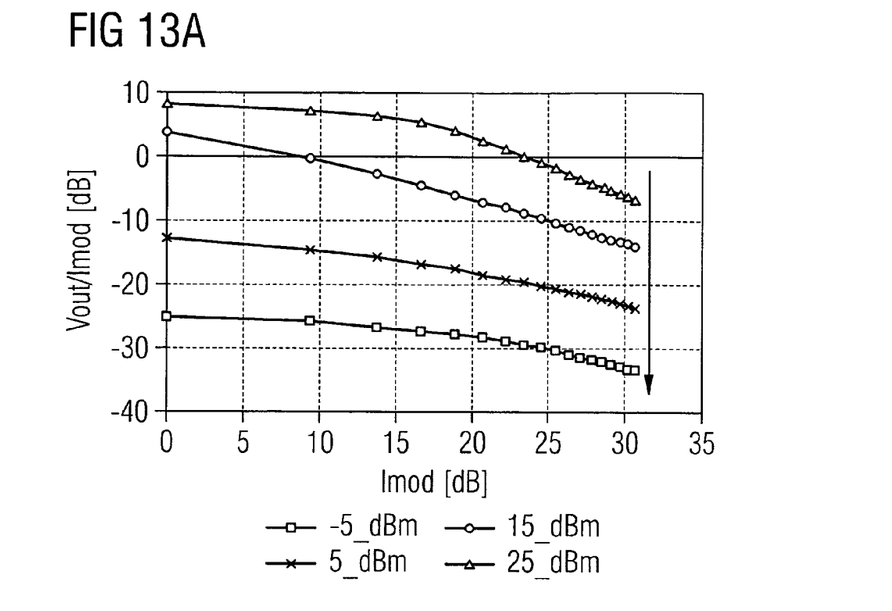
FIGS. 13A and 13B are exemplary diagrams of a transmission characteristic using bias current modulation.
Figure 13B:
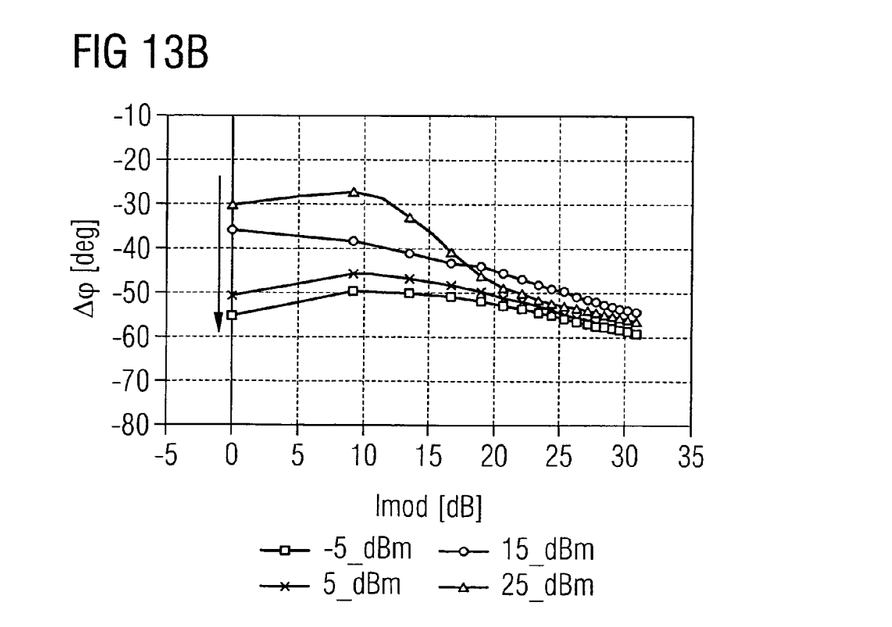

FIGS. 13A and 13B show exemplary diagrams of an amplitude and a phase response of the power amplifier when using a bias current modulation. Accordingly, in FIG. 13A, an amplitude response of the power amplifier is shown by a relation between an output signal Vout and the modulated bias current Imod as a function of the modulated bias current Imod. FIG. 13B shows the corresponding phase response of the power amplifier 70 using bias current modulation.

It can be seen from the diagrams in FIGS. 13A and 13B that distortion generated by the bias current modulation are small for lower output powers and higher for higher output powers. As described before for the supply voltage modulation, it can be possible to perform a polar modulation with the amplitude component and the phase component without applying a predistortion when using a bias current modulation with lower output powers.

As a consequence, the control unit 60 can derive the power control signal which determines the use of supply voltage modulation or bias current modulation from the power control data corresponding to a desired output power of the power amplifier 70. Also, a decision whether predistortion is activated or deactivated can be made dependent on the power control data to reduce the power consumption of the modulator arrangement.

Figure 2A:
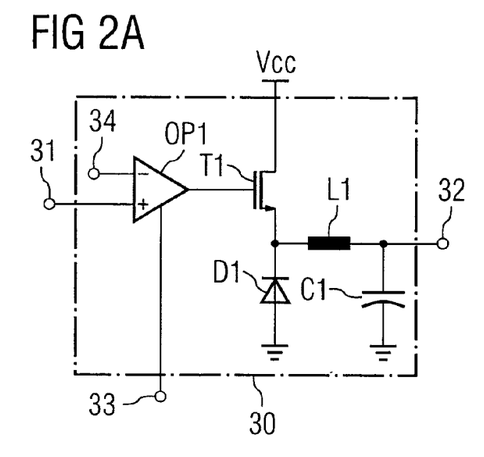
FIGS. 2A and 2B are exemplary embodiments of a supply voltage modulator according to the invention.
Figure 2B:
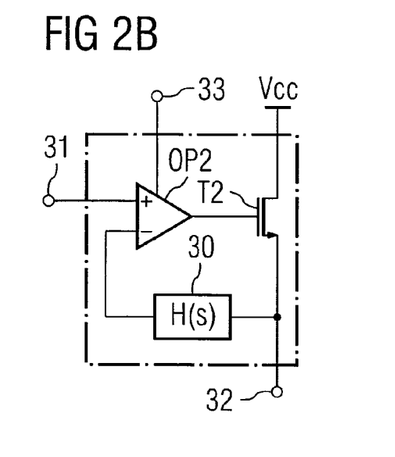

FIGS. 2A and 2B show exemplary embodiments of a supply voltage modulator 30 which can be used in an embodiment of the modulator arrangement. Other types of supply voltage modulators may also be used, and are contemplated as falling within the scope of the invention.

In FIG. 2A, the supply voltage modulator 30 comprises a buck mode DC/DC converter with an operating amplifier OP1, a switching transistor T1, a diode D1, a capacitor C1, and an inductor L1. The inductor L1 and the capacitor C1 act as an energy storage and a filtering bank. The operational amplifier OP1 compares an amplitude component at its input 31 with a reference signal at an input 34. The output signal of the operational amplifier OP1 is a pulsed signal controlling the transistor T1. In other words, the operational amplifier OP1 performs a pulse width modulation of a supply voltage VCC as a function of the amplitude component. The switched supply voltage is filtered by the filtering bank to generate a continuous output voltage at the output 32.

The operational amplifier OP1 comprises a control input 33, for example to deactivate the supply voltage modulation and to generate a constant pulse width signal and thus a constant supply voltage which is provided to the power amplifier 70, in case a bias current modulation is performed in the modulator arrangement.

In another embodiment the supply voltage modulator 30 comprises a boost DC/DC converter or a buck-boost DC/DC converter.

FIG. 2B shows another embodiment of a supply voltage modulator 30 which comprises a linear regulator which can be a low drop-out regulator (LDO). The linear regulator comprises an error amplifier OP2 which on its output side is connected to a control input of a transistor T2. The output 32 of the supply voltage modulator 30 is fed back via a transfer function H(s) to an inverting input of the error amplifier OP2. The non-inverting input of the error amplifier OP2 is coupled to the signal input 31 to receive the amplitude component.

The output of the error amplifier OP2 controls a voltage drop or a resistance of the transistor T2 which results in the modulated supply voltage at the output 32. According to the previous embodiment, the error amplifier OP2 comprises the control input 33 to deactivate the supply voltage modulator and to generate a constant supply voltage to the power amplifier 70.

Figure 3:
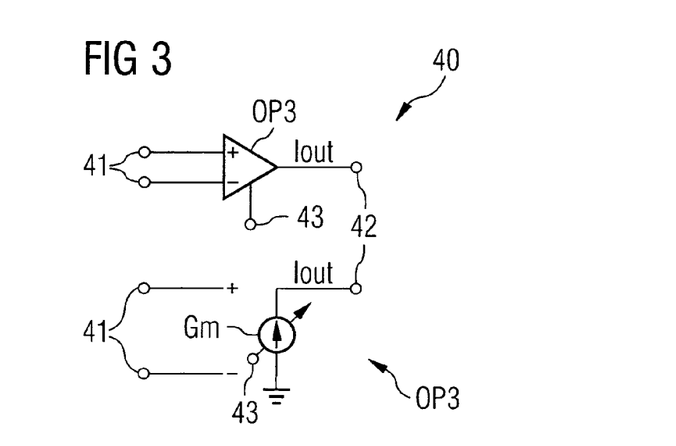
FIG. 3 is an exemplary embodiment of a bias current modulator according to the invention.

FIG. 3 shows an exemplary embodiment of a bias current modulator 40 which comprises an operational amplifier OP3. The amplifier OP3 can be an operational transconductance amplifier (OTA). The amplitude component is applied as a differential signal to its input 41 and at the output a current Iout having modulation corresponding to the amplitude component can be obtained.

The current Iout can be amplified, for example with a current mirror. FIG. 3 also shows a schematic of the amplifier OP3 wherein current Iout provided by a current source Gm is dependent on the differential input data corresponding to the amplitude component. The amplifier OP3 comprises a control input 43 for deactivating the bias current modulation and providing a constant bias current to the power amplifier 70. While FIG. 3 illustrates two exemplary bias current modulator embodiments, it should be understood that any type of bias current modulator may be employed, and such alternatives are contemplated as falling within the scope of the invention.

Figure 4:
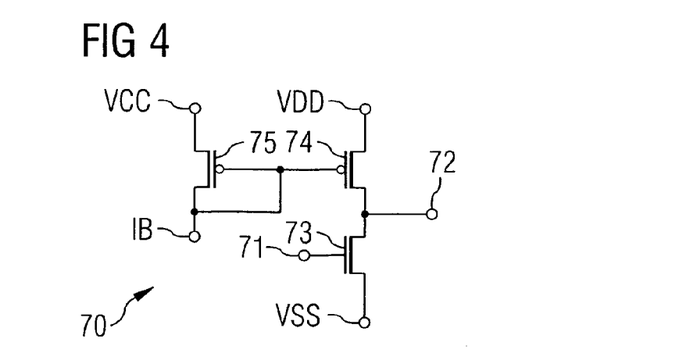
FIG. 4 is an exemplary embodiment of a power amplifier according to the invention.

FIG. 4 shows an exemplary embodiment of the power amplifier 70. A supply voltage which can be a modulated supply voltage or a constant supply voltage is applied at the voltage supply input VDD. The power amplifier further comprises transistors 74 and 75 which are arranged as a current mirror, wherein an input to the current mirror is formed by the current control input IB. A modulated or constant bias current can be provided at this current control input IB.

A transistor 73 is coupled between the transistor 74 and a reference voltage connector VSS. The control input of the transistor 73 forms the signal input 71 of the power amplifier 70. A connection between the transistors 73 and 74 forms the signal output 72 at which the modulated output signal can be provided. The amplitude of the modulated output signal depends on the supply voltage at the supply voltage input VDD and the bias current provided at the current control input IB.

Referring back to FIG. 1, the control unit 60 decides that either bias current modulation or supply voltage modulation is used and whether predistortion is required or not in both cases. In other words, the control unit 60 can decide which one of the at least four different cases, supply voltage modulation with predistortion, supply voltage modulation without predistortion, bias current modulation with predistortion and bias current modulation without predistortion, is relevant.

Accordingly, the phase modulator 50 is adjusted and controlled in order to provide a desired phase modulated input power at the input 71 of the power amplifier 70. For example, if the input power is too high compared to the respective output power, the signal quality of the output signal of the power amplifier 70 can suffer due to crosstalk. It is also possible that the system efficiency is degraded. Therefore, the signal power of the carrier signal is controlled by the control unit 60 in order to have good linearity and high efficiency at the same time. The control unit 60 also controls the operating point of the power amplifier 70, meaning which constant bias current value is set in the case of supply voltage modulation and which constant supply voltage value is set in the case of bias current modulation. Exact values, compared to which a decision is made, can be obtained, for example, by measuring the power amplifier 70, wherein the values can be stored in a database. However, decisions can also be based on further information.

Figure 5:
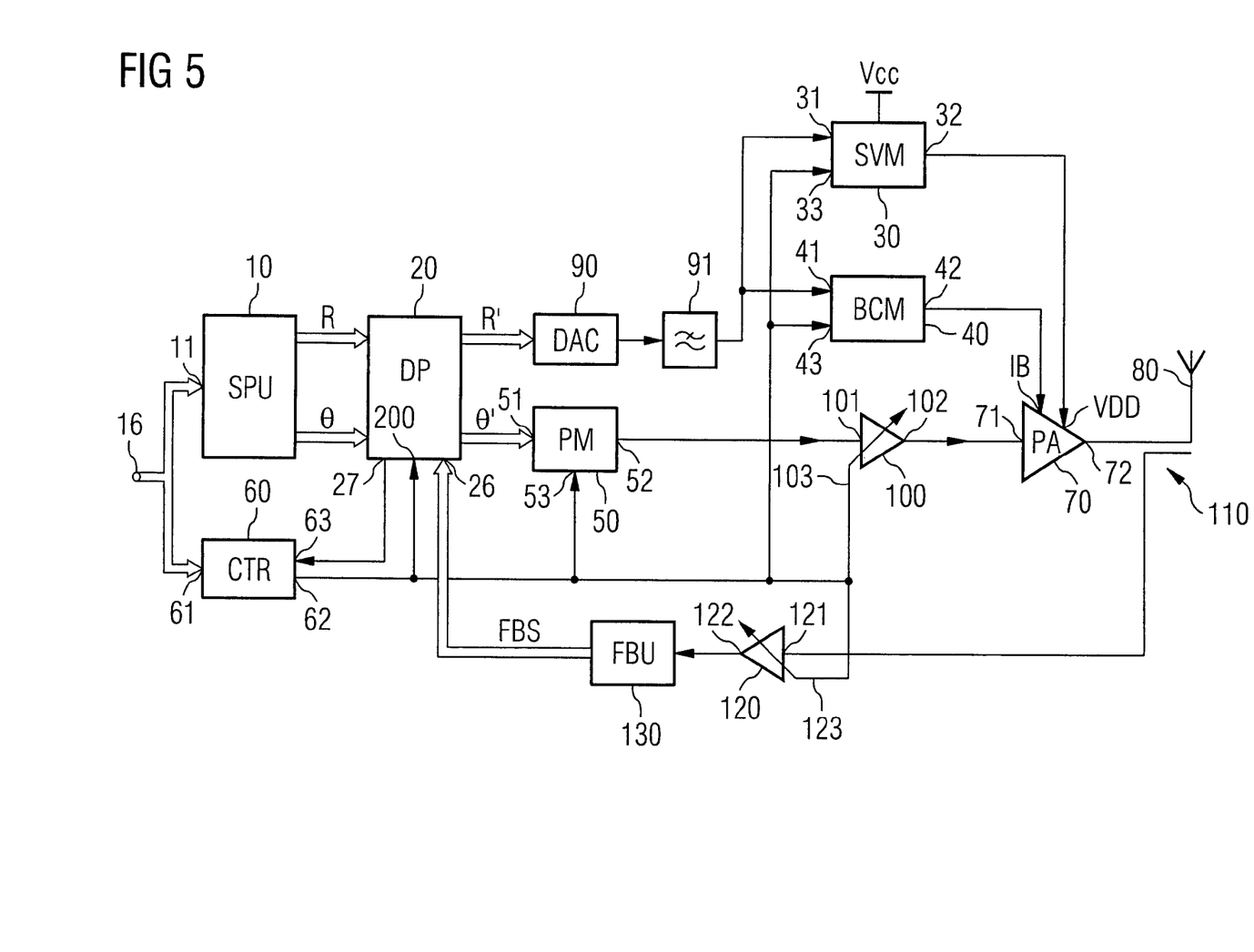
FIG. 5 is a block diagram of a second exemplary embodiment of a modulator arrangement according to the invention.

FIG. 5 shows another exemplary embodiment of a modulator arrangement. Additionally to the embodiment shown in FIG. 1, the modulator arrangement comprises a digital/analog converter 90 coupled to the output of the predistorter device 20. The output of the digital/analog converter 90 is coupled to a low pass filter 91, which filters the analog amplitude component R' and provides it to the supply voltage modulator 30 and the bias current modulator 40.

A preamplifier 100 is provided between the output 52 of the phase modulator 50 and the signal input 71 of the power amplifier 70 to adjust the amplitude of the carrier signal as a function of the output gain factor provided at a control input 103 of the preamplifier 100.

At the output 72 of the power amplifier 70 a directional coupler 110 is provided for feeding back a portion of the output signal to a feedback unit (FBU) 130. An amplifier 120 with an input 121 and an output 122 is coupled between the directional coupler 110 and the feedback unit 130. The amplifier 120 comprises a control input 123 which is coupled to the control output 62 of the control unit 60. A gain factor of the amplifier 120 can be adjusted by means of a feedback gain factor which is provided by the control unit 60. The feedback gain factor is derived from the power control signal. The amplifier 120 can be a variable gain amplifier (VGA) or a programmable gain amplifier (PGA), wherein the feedback gain factor can be provided as an analog or digital signal, respectively.

The feedback unit 130 is coupled to an input 26 of the predistorter device 20 to provide a feedback signal FBS derived from the signal provided by the directional coupler 110 and the amplifier 120. The feedback unit 130 can comprise an envelope and phase detector to provide amplitude and phase information of the output signal to the predistorter device 20. In another embodiment, the feedback unit 130 can comprise a demodulator unit to derive I/Q data corresponding to the output signal, that means data in Cartesian coordinates. In this case, either in the feedback unit 130 or in the predistorter device 20, a device can be provided to convert the I/Q data into polar data comprising an amplitude and a phase corresponding to the output signal. For example, a coordinate rotation digital computer (CORDIC) can be used for the conversion.

The predistorter device 20 can comprise a memory which stores predistorter coefficients. The selection of appropriate predistortion coefficients can be dependent on the amplitude component R provided by the signal processing unit 10. The stored coefficients correspond to specific operating states of the power amplifier 70 or the whole modulator arrangement. When operating the modulator arrangement, it is possible that that operating state changes. It can be desirable to adapt the stored predistortion coefficients to react to the changed operating state. The predistorter device 20 can compare the amplitude component R and the phase component θ with the feedback signal FBS to determine a deviation of the output signal of the power amplifier 70 compared to a desired output signal. The stored coefficients can be adapted according to the determined deviation.

The predistorter device 20 comprises an output 27 to provide an adaptation signal corresponding to an information about the adaptation process to an input 63 of the control unit 60. The comparison between the amplitude component R and the phase component θ with the feedback signal FBS further comprises information about non-linearities in the output signal of the power amplifier 70. Therefore, also the adaptation signal provided to the control unit 60 comprises the non-linearity information. Therefore, the control unit 60 can derive the predistortion control signal from the adaptation signal. In this case, the use of predistortion is dependent on non-linearities of the arrangement or the power amplifier determined during operation.

The control unit 60 can comprise a data base comprising information about different possible non-linearities in each of different communication standards as UMTS, GSM/EDGE. The adaptation signal comprising information about the non-linearities during operation can be compared to the values stored in that database and the predistortion control signal can be made dependent on the comparison result.

Figure 6:
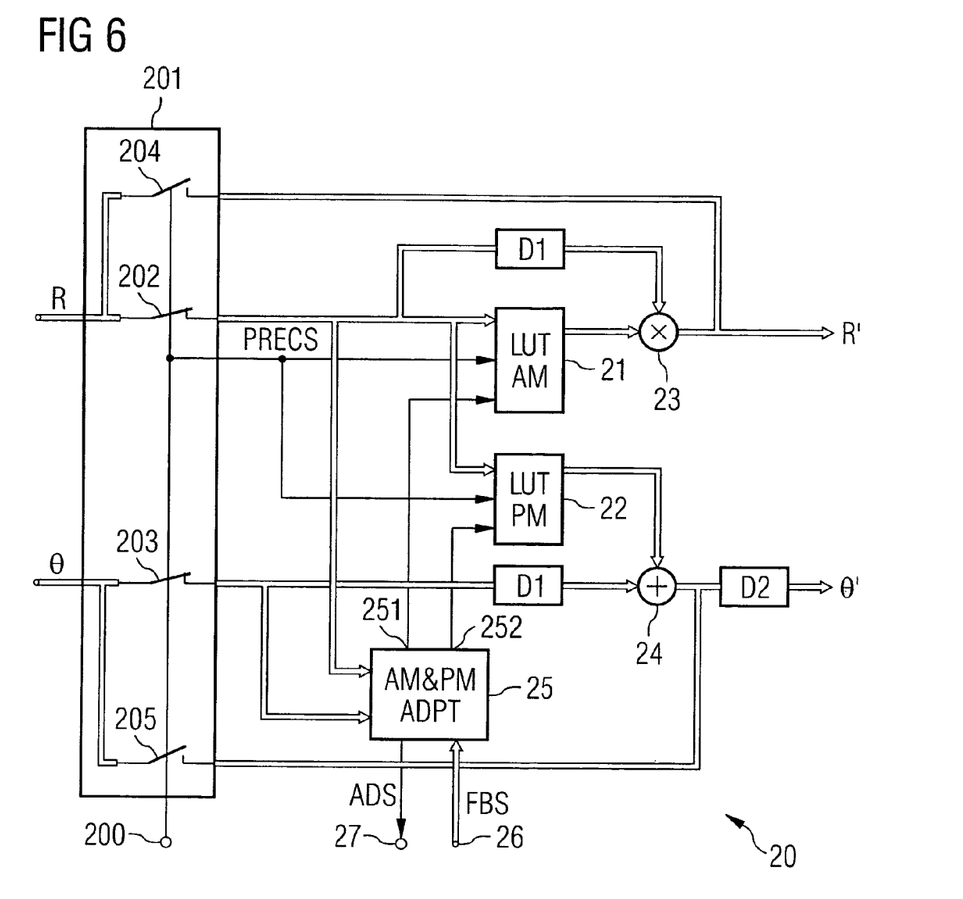
FIG. 6 is a first exemplary embodiment of a predistorter device according to the invention.

FIG. 6 shows an exemplary embodiment of a predistorter device 20. It comprises a lookup table (LUT AM) 21 for the amplitude component R and a lookup table (LUT PM) 22 for the phase component θ. The amplitude component R is provided to both of the lookup tables 21, 22 for the amplitude component and the phase component.

To predistort the amplitude component R, a predistortion coefficient corresponding to an adjustment factor is read out from the lookup table 21 depending on the amplitude component R. That predistortion coefficient is provided to a multiplier 23 to multiply the amplitude component R which is delayed by a delay element D1 with said coefficient. The result of the multiplication is the predistorted amplitude component R'.

Accordingly, a predistortion coefficient for the phase component θ is determined within the lookup table 22 depending on the amplitude component R. In this case, the determined predistortion coefficient corresponding to a phase correction factor is provided to an adder 24 which on its second input receives a phase component θ delayed by a delay element D1. The delay times of the delay elements D1 correspond to the time which is needed to read out the appropriate predistortion coefficients from the lookup tables 21, 22.

It may be necessary to provide a further delay element D2 to have the amplitude component R' and a phase component θ' synchronized to each other. In this embodiment, the further delay element D2 is arranged in the phase path of the predistorter device 20. In another embodiment, it could be possible to provide a further delay element D2 in the amplitude path of the predistorter device 20, for example after the multiplier 23.

The delay time for the delay elements D1 can be equal to an integer multiple of the clock period used for addressing the lookup tables 21, 22. Accordingly, the delay times of the delay elements D1 usually are equal. However, the delay time of the delay element D2 can be required to align magnitude and phase signals such that they reach the power amplifier 70 at the same time and a sufficiently good composite signal is obtained at the signal output 72. Therefore, it is desirable that the delay unit D2 is capable of giving delay values equal to fractions of the clock period. In other words, the predistorter device 20 can perform a time alignment of the phase and the amplitude paths.

The performing of the predistortion is controlled by the predistortion control signal PRECS provided at the control input 200. If the control unit 60 determines the operating state of the modulator arrangement such that a predistortion is not needed or not desirable, it can deactivate the predistortion via the predistortion control signal PRECS. To this end a switching unit 201 comprising switching elements 202, 203, 204, 205 is provided. Depending on the predistortion control signal PRECS the switching elements 202, 203 and the switching elements 204, 205 comprise the same switching state respectively. If the predistortion is activated, switching elements 202, 203 are closed, forwarding the input data R, θ to the lookup tables 21, 22, while switching elements 204, 205 are in an open state. In the other case, if predistortion is deactivated, switching elements 204, 205 are closed, forwarding the input data R, θ directly to an output of the predistorter device 20 as the amplitude and phase components R', θ', while switching elements 202, 202 are in an open state. The predistortion control signal PRECS is also provided to the lookup tables 21, 22 to deactivate their function, for example by switching off their supply which reduces current consumption.

The predistortion coefficients stored in the lookup tables 21, 22 correspond to an inverted transfer characteristic of the power amplifier 70. Therefore, the distortions generated by the predistorter device 20 are cancelled by the non-linear distortions of the power amplifier 70 such that the resulting output signal at the signal output 72 is linearly dependent on the input data provided at the input 16. In other words, the combination of the transfer function of the predistorter device 20 and the transfer function of the power amplifier 70 results in a linear transfer function.

As mentioned before, the non-linear behavior of the power amplifier 70 can change during operating the modulator arrangement. Therefore, it can be necessary to adapt the predistortion coefficients in a predistorter device 20 accordingly to maintain a linear total transfer function. To this end, the feedback signal FBS which is provided at the input 26 from the feedback unit 130 is provided to an adaptation unit 25 together with the desired, undistorted amplitude and phase components R, θ. From a difference calculated in the adaptation unit 25 corrected or adapted predistortion coefficients can be derived. The adapted coefficients can be provided at the outputs 251, 252 to update the coefficients in the lookup tables 21, 22.

Depending on the deviation of the input amplitude and phase components R, θ and the feedback signal FBS, also the adaptation signal ADS can be derived and provided at the output 27 which is coupled to the control unit 60.

Figure 7:
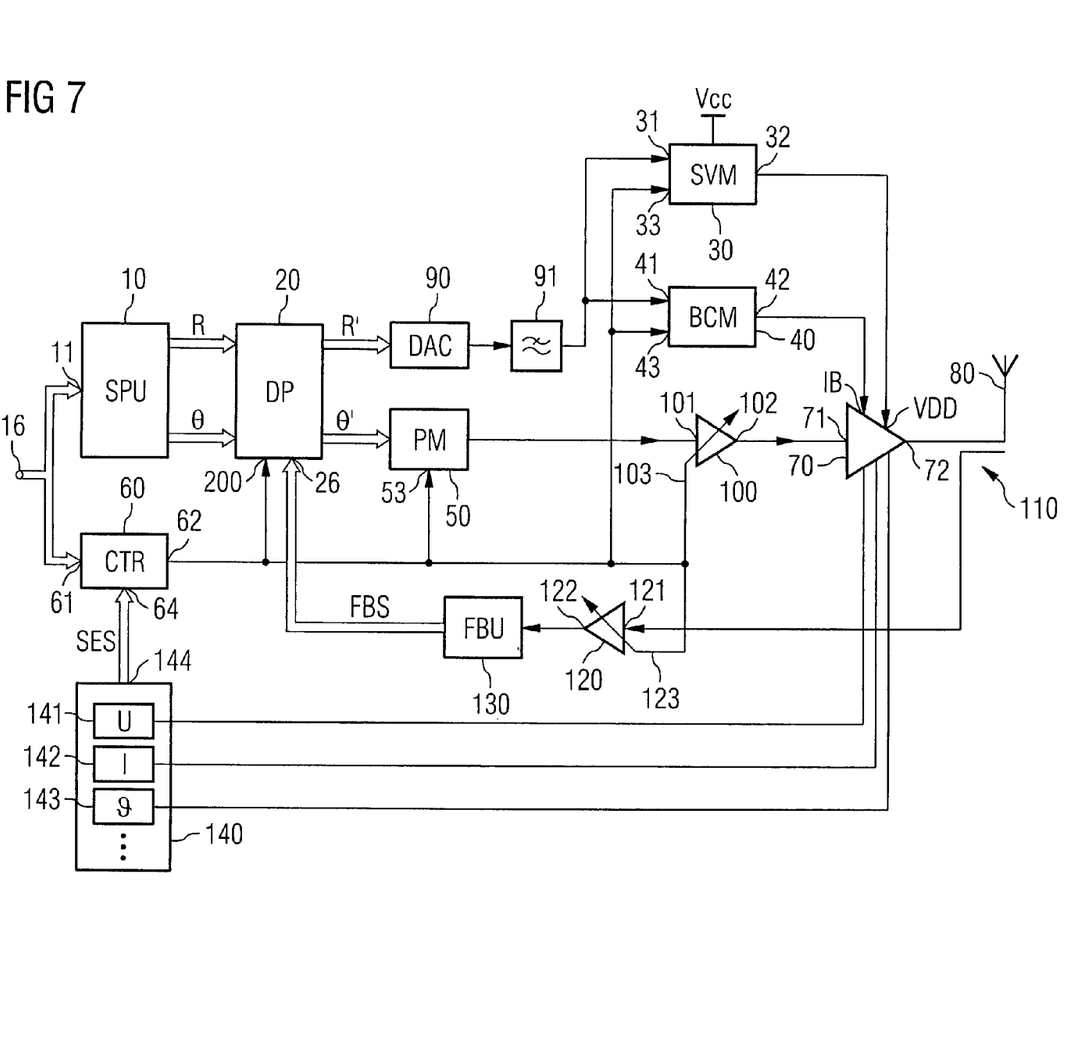
FIG. 7 is a block diagram of a third exemplary embodiment of a modulator arrangement according to the invention.

FIG. 7 shows another exemplary embodiment of a modulator arrangement according to the invention. In this embodiment, the modulator arrangement further comprises a sensor unit 140 to detect an operating state of the power amplifier 70. The sensor unit 140 comprises an output 144 which is coupled to a sensor input 64 of the control unit 60 to provide a sensor signal SES.

The sensor unit 140 further comprises a voltage sensor 141, a current sensor 142, and a temperature sensor 143 which are coupled to the power amplifier 70 to measure a current of the power amplifier, a voltage of the power amplifier, and a temperature of the power amplifier respectively.

The control unit 60 can comprise a database showing the behavior of the power amplifier 70 under different conditions for each communication standard indicated by the respective sensors. Depending on values stored in the database and the sensor signal SES provided by the sensor unit 140, the control unit 60 can further derive a predistortion control signal from the sensor signal.

Figure 8:
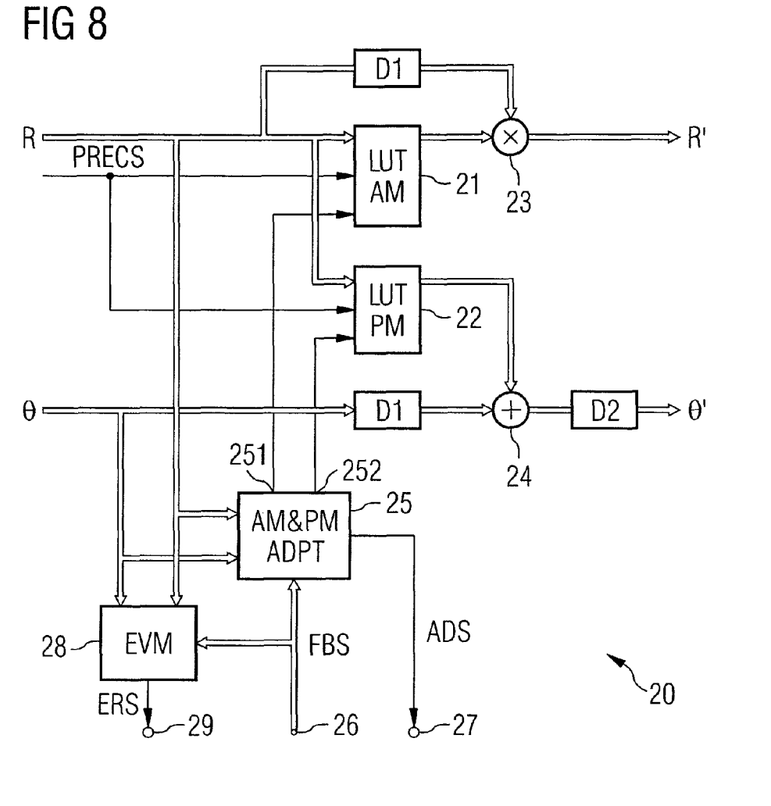
FIG. 8 is a second exemplary embodiment of a predistorter device according to the invention.

FIG. 8 shows another exemplary embodiment of a predistorter device 20. The switching unit 201 shown in FIG. 6 is omitted from this figure for simplicity reasons only. Its function can be provided also in this embodiment. Additionally to the elements shown in FIG. 6, the predistorter device 20 comprises an error detection unit 28 which receives feedback signals provided at the input 26 and provides an error signal ERS at an output 29 which is coupled to the control unit 60. The error detection unit 28 further receives the amplitude component and the phase component R, θ. In other words, the error detection unit 28 is coupled to the feedback unit 130 and to the signal processing unit 10. The error detection unit 28 derives an error signal from the amplitude component R, the phase component θ and from the feedback signal FBS. For example, the error signal ERS comprises information about an error vector magnitude, EVM, of the output signal of the power amplifier 70.

The error vector magnitude is a measure showing how good an output constellation of the power amplifier 70 matches with the ideal input constellation given by the amplitude component R and the phase component θ. If the error vector magnitude is high, there is a big deviation between input and output constellation which means a high distortion of the output signal.

Figure 9:
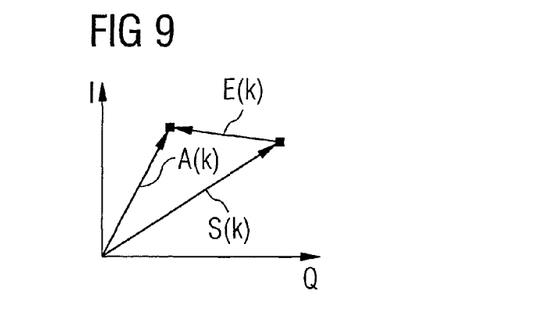
FIG. 9 is an exemplary I/Q diagram.

FIG. 9 shows an exemplary I/Q diagram of complex signals of a modulator arrangement. The vector S(k) corresponds to a desired data symbol at an instant k which can be derived from the amplitude component R and the phase component θ. The vector A(k) corresponds to an actual symbol in the output signal which can be derived from the feedback signal FBS. An error vector E(k) results from the difference between the intended symbol vector S(k) and the actual symbol vector A(k).

The error signal ERS can comprise a root mean square error vector magnitude, RMS EVM, which can be calculated by $$RMSEVM = \sqrt{\frac{\sum_{k=1}^{N} |E(k)|^2}{\sum_{k=1}^{N} |S(k)|^2}},$$

wherein N is the number of symbols used for calculation.

As an alternative, the error signal ERS can comprise a peak error vector magnitude, peak EVM, which can be calculated by $$\text{peak } EVM = \sqrt{\frac{E(k)}{\frac{1}{N}\sum_{k=1}^{N}|S(k)|^2}}.$$

In other words, the RMS EVM in one embodiment is calculated for multiple samples of input and output signals whereas the peak EVM is calculated for a maximum error vector E(k).

The control unit 60, which receives the error signal ERS, can further derive the predistortion control signal PRECS from the error signal ERS. In another embodiment, the control unit 60 further derives the power control signal from the error signal ERS.

Figure 10:
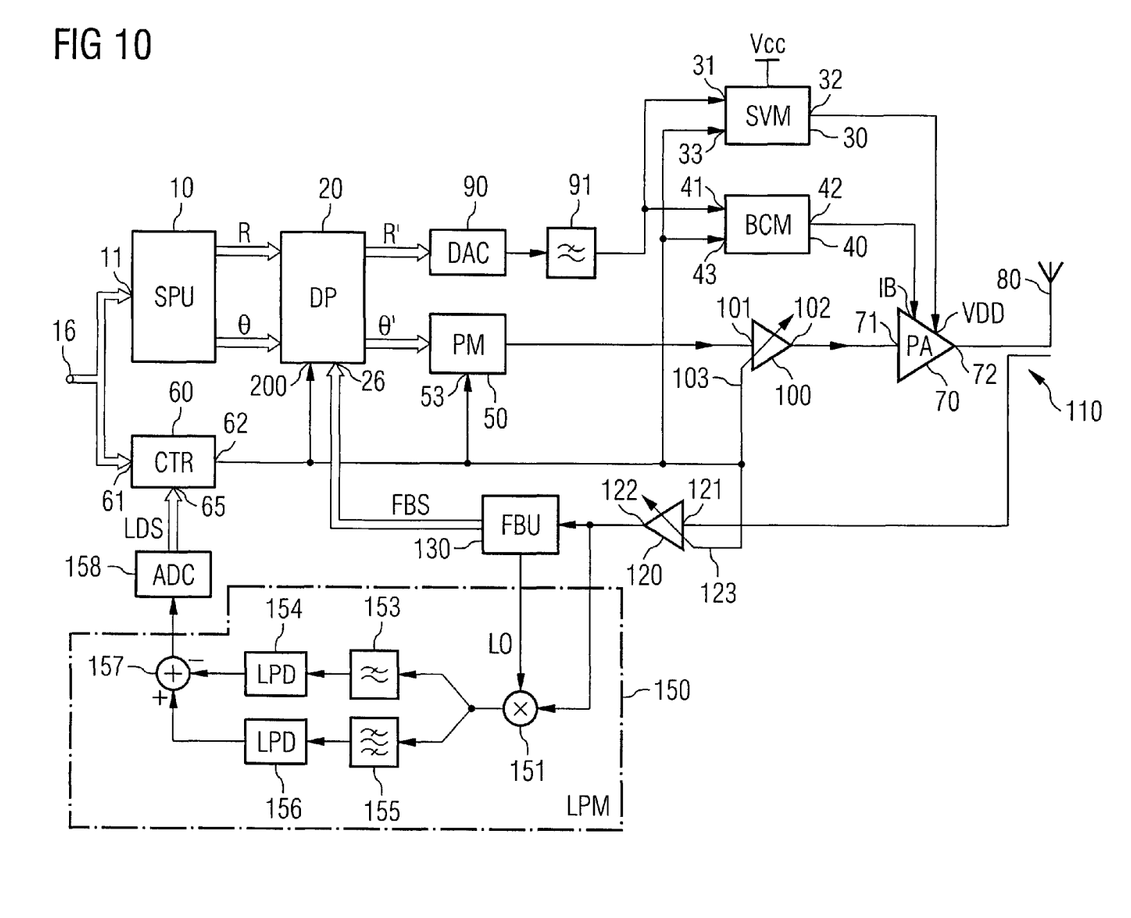
FIG. 10 is a block diagram of a fourth exemplary embodiment of a modulator arrangement according to the invention.

FIG. 10 shows another exemplary embodiment of a modulator arrangement. It further comprises a leakage detection unit 150 which is coupled to the output 122 of the amplifier 120 in the feedback path and to the feedback unit 130 to receive a local oscillator signal. It derives a leakage detection signal LDS corresponding to an adjacent channel leakage power of the power amplifier 70. The leakage detection signal LDS is provided to the control unit 60 via an analog/digital converter 158 and an input 65 of the control unit 60.

To this end, the leakage detection unit 150 comprises a multiplier 151 to down-convert the fed back output signal with the local oscillator signal LO. A low pass filter 153 and a bandpass filter 155 are coupled to the output of the multiplier 151.

Figure 11:
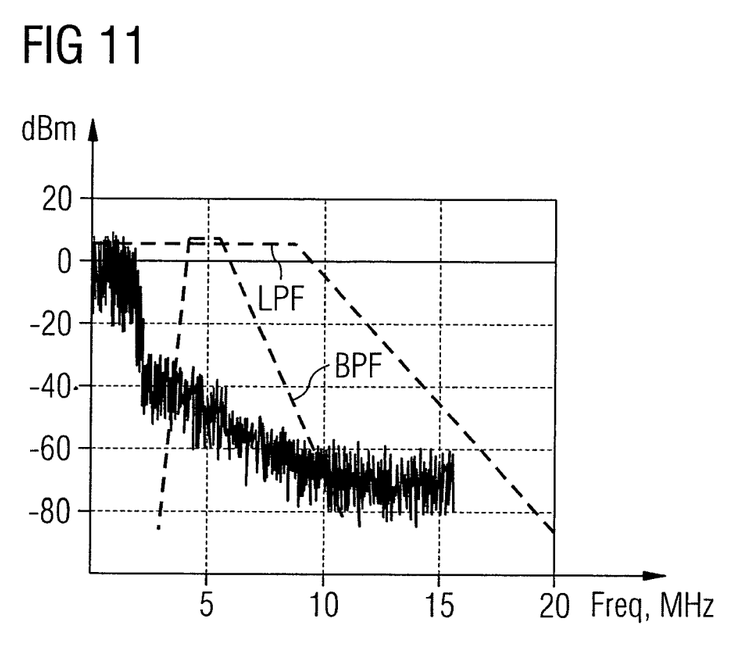
FIG. 11 is an exemplary signal spectrum.

FIG. 11 shows an exemplary frequency diagram of a fed back output signal. It further comprises exemplary characteristics of a transfer function LPF of the low pass filter 153 and BPF of the bandpass filter 155. The bandpass filter characteristic BPF covers a frequency range corresponding to the frequency range of an adjacent transmission channel, for example in UMTS. The characteristic of the low pass filter LPF may cover a wider frequency range, wherein as well the main channel as adjacent channels are included.

Referring back to FIG. 10, the leakage detection unit 150 further comprises a logarithmic power detector 154 coupled to the output of the low pass filter 153 and a logarithmic power detector 156 coupled to the output of the bandpass filter 155. Furthermore, an adder 157 is provided to sum up the output of the logarithmic power detector 156 and the negative output of the logarithmic power detector 154, wherein the result is provided to the control unit 60.

With the exemplary characteristics LPF, BPF shown in FIG. 11, the power detector 154 determines a power of the fed back signal in the main channel and in the adjacent channels. The power detector 156 determines an adjacent channel power of the fed back signal. Thus, an adjacent channel leakage power ratio (ACLR) can be determined by the adder 157.

The control unit 60 can use the leakage detection signal LDS to decide whether to use supply voltage modulation or bias current modulation and whether to use predistortion or not. In other words, the control unit 60 further derives a power control signal and a predistortion control signal from the leakage detection signal LDS. Other ways of determining a leakage power of the output signal are apparent to those skilled in the art. For example, a down-conversion with a very low intermediate frequency can be performed in order to avoid possible DC offset effects from the down conversion. In this case, the low pass filter 153 should be replaced by a bandpass filter covering the main channel. Also the bandpass characteristic BPF of the bandpass filter 155 should be modified such that its center frequency is at a determined offset from the main channel.

In another embodiment, a modulator arrangement comprises a data input to receive amplitude data and a control input to receive power data. A power amplifier is provided to perform an amplitude modulation of a carrier signal either as a function of a modulated supply voltage corresponding to the amplitude data or as a function of a modulated bias current control signal corresponding to the amplitude data depending on a power control signal. A control unit is provided to derive the power control signal from the power data.

Accordingly, an amplitude modulation of a carrier signal is performed either as a function of a modulated supply voltage corresponding to the amplitude data or as a function of a modulated bias current corresponding to the amplitude data depending on the power control signal.

The decisions which modulation type to use and whether to use predistortion can be based on other factors, too. For example, the power control signal and the predistortion control signal can be derived from a used mobile communication standard, different power modes for saving energy, or other factors corresponding to an operating state of the modulator arrangement.

In another embodiment the power amplifier 70 comprises multiple amplifier stages. An amplitude modulation can be performed in each of the amplifier stages. For example in a first amplifier stage a bias current modulation is performed depending on the power control signal. Concurrently, in a later or final amplifier stage a supply voltage modulation is performed, further depending on the power control signal. In other words, as well a modulated supply voltage as a modulated bias current or bias current control signal are provided to the power amplifier 70 to perform an amplitude modulation of the carrier signal, for example controlled by the control unit 60 depending on power control data.

Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

It is emphasized that the Abstract is provided to comply with 37 C.F.R. section 1.72(b) requiring an abstract that will allow the reader to quickly ascertain the nature and gist of the technical disclosure. It is submitted with the understanding, that it will not be used to interpret or limit the scope or meaning of the claims.

The invention claimed is:

1. A modulator arrangement, comprising:
   a power amplifier comprising a signal input configured to receive a carrier signal, a current control input, a supply voltage input and a signal output;
   a supply voltage modulator comprising an output coupled to the supply voltage input of the power amplifier and an input coupled to a data input and configured to modulate a supply voltage at the output thereof as a function of a control signal received at a control input thereof;

a bias current modulator comprising an output coupled to the current control input of the power amplifier and an input coupled to the data input, and configured to modulate a bias current at the output thereof as a function of a control signal received at a control input thereof; and a control unit comprising a power control input configured to receive power control data, and a power control output coupled to the supply voltage modulator and to the bias current modulator, and configured to control the supply voltage modulator and the bias current modulator based on one or more control signals derived from the power control data a signal processing unit coupled to the data input and configured to receive input data, and comprising a first output coupled to the respective inputs of the supply voltage modulator and the bias current modulator and configured to provide an amplitude component of the input data, and comprising a second output and configured to provide a phase component of the input data;

a phase modulator configured to provide a carrier signal which is phase modulated based on the phase component from the signal processing unit;

a predistorter device configured to predistort the amplitude and the phase component as a function of a characteristic of the power amplifier based on a predistortion control signal, wherein the predistortion control signal is generated by the control unit depending on the control signal;

a feedback unit configured to provide a feedback signal derived from an output signal of the power amplifier to the predistorter device, and wherein the feedback signal is configured to adapt predistortion coefficients stored in the predistorter device, wherein an amplitude of the feedback signal further depends on a feedback gain factor provided by the control unit depending on the control signal, wherein the predistorter device is configured to generate an adaptation signal based on the feedback signal, and wherein the control unit is further configured to derive a predistortion control signal from the adaptation signal.

2. The modulator arrangement of claim 1, further comprising a pre-amplifier coupled between the phase modulator and the power amplifier, wherein the pre-amplifier is configured to amplify the carrier signal by an output gain factor provided by the control unit depending on the control signal.

3. The modulator arrangement of claim 1, further comprising a sensor unit configured to detect an operating state of the power amplifier, and wherein the control unit is coupled to an output of the sensor unit and is configured to receive a sensor signal therefrom and derive a predistortion control signal based thereon.

4. The modulator arrangement of claim 3, wherein the sensor unit comprises at least one of a current sensor configured to measure a current of the power amplifier, a voltage sensor configured to measure a voltage of the power amplifier, and a temperature sensor configured to measure a temperature of the power amplifier.

5. A modulator arrangement, comprising:

a power amplifier comprising a signal input configured to receive a carrier signal, a current control input, a supply voltage input and a signal output;

a supply voltage modulator comprising an output coupled to the supply voltage input of the power amplifier and an input coupled to a data input and configured to modulate a supply voltage at the output thereof as a function of a control signal received at a control input thereof;

a bias current modulator comprising an output coupled to the current control input of the power amplifier and an input coupled to the data input, and configured to modulate a bias current at the output thereof as a function of a control signal received at a control input thereof; and a control unit comprising a power control input configured to receive power control data, and a power control output coupled to the supply voltage modulator and to the bias current modulator, and configured to control the supply voltage modulator and the bias current modulator based on one or more control signals derived from the power control data;

a signal processing unit coupled to the data input and configured to receive input data, and comprising a first output coupled to the respective inputs of the supply voltage modulator and the bias current modulator and configured to provide an amplitude component of the input data, and comprising a second output and configured to provide a phase component of the input data;

a phase modulator configured to provide a carrier signal which is phase modulated based on the phase component from the signal processing unit a predistorter device configured to predistort the amplitude and the phase component as a function of a characteristic of the power amplifier based on a predistortion control signal, wherein the predistortion control signal is generated by the control unit depending on the control signal;

a feedback unit configured to provide a feedback signal derived from an output signal of the power amplifier to the predistorter device, and wherein the feedback signal is configured to adapt predistortion coefficients stored in the predistorter device, wherein an amplitude of the feedback signal further depends on a feedback gain factor provided by the control unit depending on the control signal; and an error detection unit coupled to the feedback unit and to the signal processing unit, and configured to derive an error signal from the amplitude component, the phase component and the feedback signal, wherein the control unit is configured to receive the error signal and to further derive the predistortion control signal as a function of the error signal.

6. A modulator arrangement, comprising:

a power amplifier comprising a signal input configured to receive a carrier signal, a current control input, a supply voltage input and a signal output;

a supply voltage modulator comprising an output coupled to the supply voltage input of the power amplifier and an input coupled to a data input and configured to modulate a supply voltage at the output thereof as a function of a control signal received at a control input thereof;

a bias current modulator comprising an output coupled to the current control input of the power amplifier and an input coupled to the data input, and configured to modulate a bias current at the output thereof as a function of a control signal received at a control input thereof; and a control unit comprising a power control input configured to receive power control data, and a power control output coupled to the supply voltage modulator and to the bias current modulator, and configured to control the supply voltage modulator and the bias current modulator based on one or more control signals derived from the power control data;

a signal processing unit coupled to the data input and configured to receive input data, and comprising a first output coupled to the respective inputs of the supply voltage modulator and the bias current modulator and configured to provide an amplitude component of the input data, and comprising a second output and configured to provide a phase component of the input data;

a phase modulator configured to provide a carrier signal which is phase modulated based on the phase component from the signal processing unit;

a predistorter device configured to predistort the amplitude and the phase component as a function of a characteristic of the power amplifier based on a predistortion control signal, wherein the predistortion control signal is generated by the control unit depending on the control signal; and a leakage detection unit configured to provide a leakage detection signal corresponding to a leakage power of the power amplifier, wherein the control unit further derives the control signal and the predistortion control signal as a function of the leakage detection signal.

7. A modulator arrangement, comprising:

a signal processing unit configured to receive input data and provide an amplitude component of the input data at a first output and a phase component of the input data at a second output;

a phase modulator coupled to the second output and configured to generate a phase modulated carrier signal as a function of the phase component;

a power amplifier configured to receive the carrier signal, and comprising a current control input, a supply voltage input, and a signal output;

a supply voltage modulator configured to modulate a supply voltage and provide the modulated supply voltage to the supply voltage input of the power amplifier;

a bias current modulator configured to modulate a bias current and provide the modulated bias current to the current control input of the power amplifier; and a control unit configured to receive power control data and selectively control the supply voltage modulator and the bias current modulator with a power control signal derived from the power control data, wherein the amplitude component and the phase component comprise digital components;

a predistorter device configured to predistort the amplitude component and the phase component as a function of the amplitude component and selected predistortion coefficients stored in the predistorter device, wherein the selected coefficients are based on a predistortion control signal, and wherein the predistortion control signal is generated by the control unit and is based on the power control signal;

a feedback unit configured to provide a feedback signal corresponding to an output signal of the power amplifier to the predistorter device, wherein the feedback signal is configured to adapt the predistortion coefficients, and wherein an amplitude of the feedback signal further depends on a feedback gain factor provided by the control unit based on the power control signal, wherein the predistorter device is configured to generate an adaptation signal, and wherein the control unit is further configured to derive the predistortion control signal from the adaptation signal.

8. The modulator arrangement of claim 7, further comprising a preamplifier coupled between the phase modulator and the power amplifier, and configured to amplify the carrier signal by an output gain factor based on the power control signal.

9. The modulator arrangement of claim 7, further comprising a sensor unit configured to derive a sensor signal corresponding to an operating state of the power amplifier, wherein the sensor unit comprises at least one of a current sensor configured to measure a current of the power amplifier, a voltage sensor configured to measure a voltage of the power amplifier and a temperature sensor configured to measure a temperature of the power amplifier, and wherein the control unit is further configured to derive the predistortion control signal from the sensor signal.

10. A modulator arrangement, comprising:

a signal processing unit configured to receive input data and provide an amplitude component of the input data at a first output and a phase component of the input data at a second output;

a phase modulator coupled to the second output and configured to generate a phase modulated carrier signal as a function of the phase component;

a power amplifier configured to receive the carrier signal, and comprising a current control input, a supply voltage input, and a signal output;

a supply voltage modulator configured to modulate a supply voltage and provide the modulated supply voltage to the supply voltage input of the power amplifier;

a bias current modulator configured to modulate a bias current and provide the modulated bias current to the current control input of the power amplifier; and a control unit configured to receive power control data and selectively control the supply voltage modulator and the bias current modulator with a power control signal derived from the power control data, wherein the amplitude component and the phase component comprise digital components;

a predistorter device configured to predistort the amplitude component and the phase component as a function of the amplitude component and selected predistortion coefficients stored in the predistorter device, wherein the selected coefficients are based on a predistortion control signal and wherein the predistortion control signal is generated by the control unit and is based on the power control signal a leakage detection unit configured to generate a leakage detection signal corresponding to a leakage power of the power amplifier, and wherein the control unit is further configured to derive the power control signal and the predistortion control signal from the leakage detection signal.

11. A modulator arrangement, comprising:

a signal processing unit configured to receive input data and provide an amplitude component of the input data at a first output and a phase component of the input data at a second output;

a phase modulator coupled to the second output and configured to generate a phase modulated carrier signal as a function of the phase component;

a power amplifier configured to receive the carrier signal, and comprising a current control input, a supply voltage input, and a signal output;

a supply voltage modulator configured to modulate a supply voltage and provide the modulated supply voltage to the supply voltage input of the power amplifier;

a bias current modulator configured to modulate a bias current and provide the modulated bias current to the current control input of the power amplifier; and a control unit configured to receive power control data and selectively control the supply voltage modulator and the bias current modulator with a power control signal derived from the power control data, wherein the amplitude component and the phase component comprise digital components;

a predistorter device configured to predistort the amplitude component and the phase component as a function of the amplitude component and selected predistortion coefficients stored in the predistorter device, wherein the selected coefficients are based on a predistortion control signal, and wherein the predistortion control signal is generated by the control unit and is based on the power control signal;

a feedback unit configured to provide a feedback signal corresponding to an output signal of the power amplifier to the predistorter device, wherein the feedback signal is configured to adapt the predistortion coefficients, and wherein an amplitude of the feedback signal further depends on a feedback gain factor provided by the control unit based on the power control signal, an error detection unit configured to generate an error signal from the first and the second components and from the feedback signal, and wherein the control unit is further configured to derive the predistortion control signal from the error signal.

12. A method for signal modulation, comprising:

providing input data and power data;

deriving a power control signal from the power data;

providing a supply voltage and a bias current control signal, wherein the supply voltage or the bias current control signal are selectively modulated as a function of the input data based on the power control signal;

amplifying a carrier signal as a function of the supply voltage and the bias current control signal, wherein the amplified carrier signal comprises an output signal selectively predistorting the amplitude component and the phase component as a function of a characteristic of the amplification based on a predistortion control signal which is derived from the power control signal, wherein a feedback signal derived from the output signal is fed back to adapt stored predistortion coefficients and an amplitude of the feedback signal further is based on a feedback gain factor derived from the power control signal, wherein an error signal of the output signal is derived from the amplitude component, the phase component and the feedback signal, and wherein the power control signal and the predistortion control signal are further derived from the error signal.

13. The method of claim 12, further comprising deriving an amplitude component and a phase component from the input data, wherein the modulation of the supply voltage or the bias current control signal is performed as a function of the amplitude component, and the carrier signal is derived from the phase component by a phase modulation.

14. The method of claim 12, wherein a gain factor of the amplifying depends on an output gain factor derived from the power control signal.

15. The method of claim 12, wherein the predistortion control signal is further determined as a function of the adaptation of the predistortion coefficients.

16. The method of claim 12, wherein the predistortion control signal is further derived from an operating state corresponding to the amplification.

17. The method of claim 16, wherein the operating state is determined from at least one of a current of the amplification, a voltage of the amplification, and a temperature of the amplification.

18. The method of claim 12, wherein the error signal is a function of an error vector magnitude of the output signal.

19. The method of claim 12, wherein a leakage detection signal corresponding to a leakage power of the output signal is derived, and wherein the power control signal and the predistortion control signal are derived from the leakage detection signal.

20. The method of claim 12, wherein a modulated supply voltage and a modulated bias current control signal are provided.

* * * * *